Jan. 22, 1963 G. F. FISHER 3,074,392

METHOD AND APPARATUS FOR DRILLING MINUTE HOLES IN SMALL CERAMIC WAFERS OR THE LIKE

Filed Dec. 7, 1959

INVENTOR.
George F. Fisher

BY

Hovey, Schmidt, Johnson & Hovey
ATTORNEYS.

3,074,392
Patented Jan. 22, 1963

3,074,392

METHOD AND APPARATUS FOR DRILLING MINUTE HOLES IN SMALL CERAMIC WAFERS OR THE LIKE

George F. Fisher, Parkville, Mo., assignor to Midland Manufacturing Co., Inc., Kansas City, Kans., a corporation of Kansas Filed Dec. 7, 1959, Ser. No. 857,808
5 Claims. (Cl. 125—20)

This invention relates generally to the field of modular circuit structures for use in electronic equipment and particularly, to an improved method and apparatus for forming minute holes in small ceramic wafers employed in piezoelectric crystal units.

The present invention is related to an attempt by specialists in various electronic fields to develop new and improved components for use in cooperation with each other to present modular circuit structures of hitherto unknown miniaturization of size, minimization of weight and optimization of ruggedness, reliability and performance.

The task of developing an optimumly miniaturized modular circuit employing a piezoelectric crystal presented many problems not encountered in connection with miniaturization of certain other types of components, it being found that the dimensioning of the piezoelectric element itself was a critical factor in determining the frequency of operation thereof; that the piezoelectric element must be mounted so as not to be unduly damped or otherwise restricted against freedom to vibrate at the desired frequency of operation; that the piezoelectric elements of the dimensions involved must be protected from damage thereto because of the extremely fragile nature of the same; the piezoelectric crystal assembly must be hermetically sealed; and the piezoelectric component maintained in predetermined relationship between conductive and insulating parts while at the same time, permitting connection of various electrode structures to the piezoelectric element itself. The magnitude of each of the problems referred to above was seriously compounded by the degree of miniaturization required, inasmuch as the piezoelectric crystal apparatus must be capable of resonance at frequencies of from the order of 120 megacycles down to about 7 megacycles or lower, yet the entire apparatus should not occupy a space exceeding 0.05 in. x 0.3 in. x 0.3 in., that is a volume of about 0.0045 cubic in.

It was determined that the proper miniaturization required could best be obtained by employing a number of extremely thin wafers of nonconductive ceramic material disposed in stacked relationship presenting a laminar module and with one or more of the central wafers having an opening therein of a size to receive the piezoelectric crystal itself. In this manner, flat metallic leads may be interposed between a pair of adjacent wafers and suitably connected to wires or conductive areas provided on the edges of the laminated module. However, since each of the wafers cannot exceed the 0.3 in. x 0.3 in. dimensions referred to above as well as a maximum thickness of 0.03 in. and preferably of the order of 0.01 in., it can be ascertained that numerous problems were encountered in forming an accurately dimensioned opening in the central portion of one of the wafers, with such opening normally having a maximum diameter of about 0.2 in.

It is therefore the primary object of this invention to provide a novel method as well as apparatus for drilling holes of the order referred to above in brittle, readily fracturable ceramic wafers which do not exceed about 0.3 in. x 0.3 in. in depth and width.

A still further important object of the invention relates to the provision of a method and apparatus for drilling very small holes in one or more wafers utilized in a micromodule assembly wherein the hole so formed is perfectly dimensioned to receive a piezoelectric crystal or the like and without further manufacturing processes or operations being required to bring the crystal receiving opening to required, highly accurate dimensions.

Also an important aim of the invention is to provide a method and apparatus for drilling minute holes in a ceramic wafer which, although extremely hard, is subject to relatively easy fracturing, with the hole of required size being formed therein by employing a rotatable drill element having an annular working surface on one end thereof adapted to be moved into pressing engagement with one major face of the wafer and with the cutting action being provided by a suitable abrasive composition interposed between the annular surface of the drilling element and the defined major face of the wafer to thereby cause an annular area of the wafer to be ground away by the abrasive and eventually produce an opening in the ceramic component of desired dimensions.

Another important aim of the invention is to provide a method and apparatus as described above wherein the rotatable element having the annular working surface thereon is provided with a number of inwardly extending slots in the edge portion thereof dividing the working surface into a number of spaced segments which not only improves the grinding action with the abrasive but also serves to draw the abrasive composition in toward the cutting edge of the rotatable drill element.

An additional important object of the invention is to provide drilling apparatus for forming small holes in miniaturized module wafers wherein the drilling element, having an annular working surface on one end thereof, is preferably constructed of a relatively soft metal such as copper so as to permit particles of the abrasive to become partially embedded in the working surface of the element and resulting in more efficient drilling without the necessity of forcing the element toward the wafer under a pressure which would increase the danger of fracturing of the wafer.

An additional important object of the invention is to provide a process as defined above which is equally advantageous for drilling holes in various types of readily fracturable components from materials such as quartz and glass in addition to ceramic articles.

Other important objects and details of the present method as well as the apparatus employed in carrying out such method will become obvious or be explained in greater detail as the following specification progresses.

Figure 1:
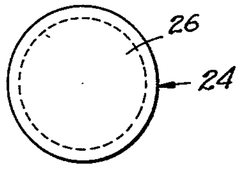
FIGURE 1 is a plan view of the novel drilling element forming a part of the present apparatus.
Figure 2:
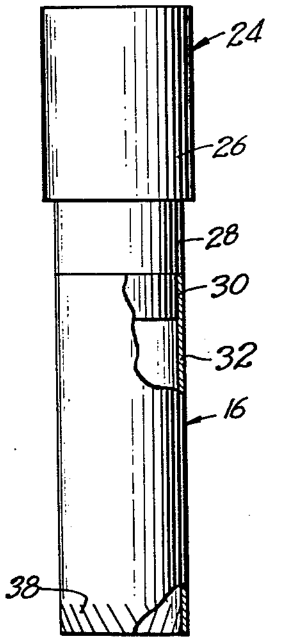
FIG. 2 is a side elevational view of the element illustrated in FIG. 1, with certain parts thereof being broken away and in section to reveal details of construction of the same.

It is to be understood that in illustrating and describing an exemplary, preferred embodiment of the invention, reference will be made to certain specific dimensions and materials utilized in the preferred construction, but that those skilled in the art may manifestly use differing dimensions or equivalent materials to meet the requirements of special applications.

It will also be apparent that certain other details of construction employed in the preferred apparatus disclosed for illustrative purposes only, will be subject to variation by those skilled in the art without departing from the principles of the invention.

The wafer broadly designated 10 in the drawing and which constitutes a central part of the laminar micromodule and thereby requires a centrally disposed opening in the same to receive a piezoelectric crystal or the like, is of ceramic characteristics and preferably an alumina substrate. In the preferred construction, the principal dimensions of the wafer 10 are 0.3 in. x 0.3 in. with the preferred thickness of 0.01 in., the diameter of the hole to be formed therein preferably being of the order of 0.2 in. For reasons not constituting a part of the present invention, wafer 10 has a series of notches 12 in the outer periphery thereof and which are coated with electrically conductive means either before or after wafer 10 has been placed in stacked relationship with a number of other wafers.

Figure 4:
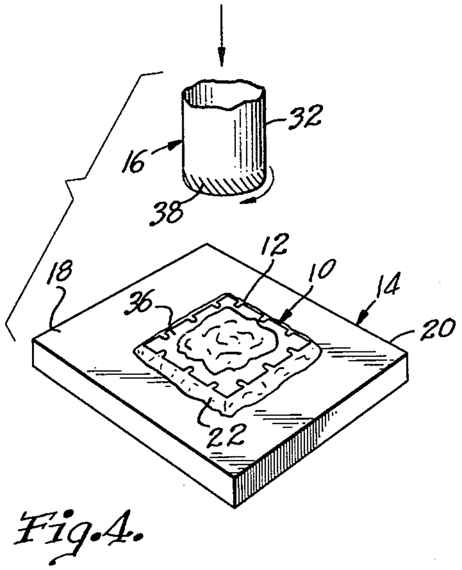
FIG. 4 is a fragmentary view in reduced size showing the base for mounting the wafer to be drilled as well as the lower end of the rotatable drilling element.

The apparatus for drilling a minute hole in wafer 10 includes a base 14 and a drilling element 16 adapted to be disposed in generally overlying relationship to the uppermost flat face 18 of glass plate 20, which comprises the major part of base 14. As best shown in FIG. 4, wafer 10 is adapted to be positioned with one flat surface thereof in complemental engagement with the upper flat face 18 of plate 20 and in this connection, it is to be preferred that an adhesive material 22 be utilized to firmly affix wafer 10 to face 18 of plate 20.

Figure 3:
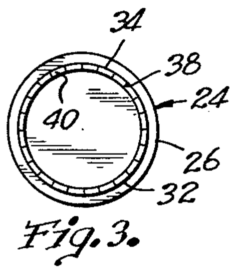
FIG. 3 is a bottom view of the element shown in FIGS. 1 and 2.

Element 16 includes an upper chuck member 24 having a head section 26 adapted to be received within the chuck of a drill press or the like, while lower section 28 of member 24 has a reduced section 30 at the lower extremity thereof adapted to be frictionally telescoped within cylinder 32 of element 16. As best shown in FIG. 3, the lower circular edge 34 of cylinder 32 presents an annular working surface adapted to engage the upper exposed major face 36 of wafer 10 when the latter is placed on face 18 of plate 20.

The lower margin of cylinder 32 presenting edge 34 has a series of elongated, angularly disposed notches 38 formed therein in substantially parallel relationship around the circumference of cylinder 32 and dividing edge 34 into a number of spaced segments 40. It is to be noted that the width of each of the notches 38 is substantially less than the length thereof and also the width of each of the segments 40 presented by such notches. It is to be preferred that element 16 and thereby cylinder 32 be rotated in a direction to cause the innermost extremity of each of the notches 38 to lead the outermost part of such notches as indicated by the directional arrow in FIG. 4. Although cylinder 32 of element 16 may be constructed of various metals, the preferred results have been obtained by utilizing a copper tube of the required dimensions and which is thereby capable of forming the required hole in wafer 10 without fracturing the latter.

In utilization of the described apparatus to produce a minute hole in wafer 10, diamond dust dispersed in an oil vehicle is initially placed on the upper exposed face 36 of wafer 10, whereupon element 16 is then moved downwardly until segments 40 of working surface 34 are in pressing engagement with the diamond dust and thereby a complemental annular area of wafer 10. By utilizing diamond dust in an oil vehicle, only a very small amount of the composition is required with the latter remaining adjacent the hole being drilled and without the need for employing any type of retaining wall or the like to form a puddle of the liquid.

Figure 5:
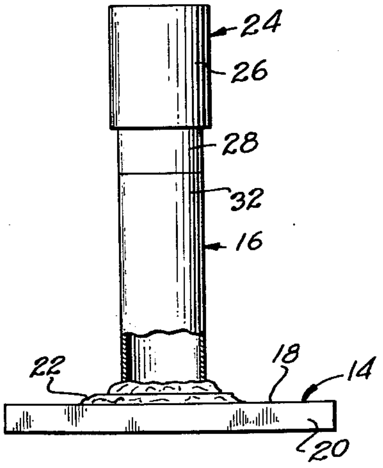
FIG. 5 is a side elevational view showing the position of the drilling element relative to the wafer and the base therefor, with certain parts of the drilling element being broken away to show the construction of the side wall thereof.

Element 16 is then caused to rotate in a clockwise direction, viewing FIGS. 4 and 5, whereupon the working surface of cylinder 32 acting through the diamond dust abrasive causes the annular area of wafer 10 corresponding to the configuration of edge 34 to be ground away, thus resulting in formation of a hole in wafer 10 of the desired dimensions. Drilling of wafer 10 with element 16 is continued until the working edge of cylinder 32 removes a portion of the upper face 18 of plate 20 to assure production of an opening in wafer 10, wherein the side walls thereof are substantially perpendicular to the axis of the opening. In this manner, no adidtional processing of the wafer is required and the same is of very accurate dimensions, adapted to receive the piezoelectric crystal or other component therewithin.

The notches 38 in element 16 serve to automatically recharge the drilling tool during rotational motion thereof. Notches 38, which slant rearwardly with respect to the normal direction of rotation of element 16, present a lower working surface segment between each pair of notches 38 and an upwardly extending surface at an oblique angle with respect to a corresponding segment of said working surface whereby the liquid containing diamond dust is caused to flow downwardly through respective notches and then under the lower working surface segment of the element 16. This action aids in "charging" of the outer surface of the element with particles of diamond dust and thereby increases the rate of drilling. Also, periodic lifting of the element as defined above causes worn tool stock and work stocks to be flushed from the annular groove in said wafer and thereby increases the cutting rate.

During the drilling operation, it is desirable to intermittently raise cylinder 32 out of engagement with wafer 10 to permit the diamond dust abrasive to again pass beneath the working surface of cylinder 32, whereupon element 16 may again be reciprocated to a position with the working surface of cylinder 32 in pressing engagement with the annular groove formed in face 36 of wafer 10. It is to be noted, however, that the provision of notches 38 in the lower extremity of cylinder 32 serves to draw the abrasive mixture toward the cutting edge and thus limiting the number of times in which the cylinder 32 should preferably be raised so as to cause the working edge thereof to clear the upper part of wafer 10.

Having thus described the invention what is claimed as new and desired to be secured by Letters Patent is:

1. In a method of drilling a minute hole in a brittle, readily fracturable, silicate wafer of small size comprising the steps of securing the wafer to a supporting base with one major face of the wafer exposed; depositing a fluid, particulate abrasive composition on a predetermined portion of said exposed face of the wafer; exerting a series of pressures on circumferentially spaced, arcuate areas of said portion of the wafer with the line of action of each of said pressures being in a direction substantially perpendicular to said one major face of the wafer and in relatively close proximity to the lines of action of adjacent pressures, each of said pressures including a rotational force vector of predetermined speed, said pressures being disposed for causing said abrasive to flow between said lines of action and onto said areas to wear away the latter by grinding action; and permitting said abrasive to flow onto said areas as said pressures are exerted thereon to augment said grinding action and thereby produce said hole, certain of the particles being moved at said predetermined speed while other of the particles are moved at lesser speed.

2. A method of drilling as set forth in claim 1, wherein said pressures are applied to cause the abrasive to flow downwardly along an inclined path between said lines of force and against the direction of rotation of said force vectors.

3. Apparatus for drilling a minute hole in a brittle, readily fracturable silicate wafer of small size and while the same is mounted on a base with one major face thereof exposed, said apparatus including an elongated, tubular element adapted to be mounted adjacent said base for rotation about the longitudinal axis thereof and provided with an annular working surface at the end thereof normally proximal to said wafer, said end of said element being provided with a number of circumferentially spaced slots therein dividing said annular working surface of the element into a series of spaced segments, the edges of said element at said end defining a corresponding slot being in relatively close proximity with each other and being angularly disposed with respect to said longitudinal axis to provide inclined paths between said segments for the flow of a fluid particulate abrasive toward said face of the wafer, the upper end of each slot being disposed in advance of the lower end thereof as said element is rotated, whereby when said abrasive is deposited on said one major face of the wafer, said element may be shifted toward the wafer until the working surface is in pressing engagement with the abrasive and thereby circumferentially spaced areas of the wafer and the element may be rotated about said axis thereof, said working surface through the medium of said abrasive being adapted for wearing away said areas of the wafer to produce said hole therein, said element being of metallic material having a hardness permitting particles of abrasive to become partially embedded in the working surface thereof.

4. Apparatus as set forth in claim 3, wherein said slots are considerably narrower than the distance between adjacent slots.

5. Apparatus as set forth in claim 3, wherein said element has a generally cylindrical side wall and the slots extend entirely through said side wall at said end of the element.

References Cited in the file of this patent

UNITED STATES PATENTS

| | | |
|---|---|---|
| 1,244,716 | Dreyfus | Oct. 30, 1917 |
| 1,385,732 | Taylor | July 26, 1921 |
| 1,620,255 | Hall | Mar. 8, 1927 |
| 1,772,001 | Hall et al. | Aug. 5, 1930 |
| 1,825,277 | Lytle | Sept. 29, 1931 |
| 2,504,831 | Criss | Apr. 18, 1950 |
| 2,764,967 | Cupler | Oct. 2, 1956 |
| 2,814,495 | Ploegsma | Nov. 26, 1957 |
| 3,003,493 | Miller | Oct. 10, 1961 |